United States Patent [19]

Jacomb-Hood

[11] Patent Number: 5,317,290

[45] Date of Patent: May 31, 1994

[54] MMIC (MONOLITHIC MICROWAVE INTEGRATED CIRCUIT) SWITCHABLE BIDIRECTIONAL PHASE SHIFT NETWORK

[75] Inventor: Anthony W. Jacomb-Hood, Liverpool, N.Y.

[73] Assignee: General Electric Company, Syracuse, N.Y.

[21] Appl. No.: 110,015

[22] Filed: Oct. 19, 1987

[51] Int. Cl.$^5$ .............................................. H03H 11/20
[52] U.S. Cl. ...................................... 333/164; 333/161
[58] Field of Search ............... 333/164, 161, 156, 139, 333/103, 104

[56] References Cited

U.S. PATENT DOCUMENTS 4,435,841  3/1984  Dobrovolny ..................... 333/103
4,733,203  3/1988  Ayasli ............................. 332/103 X

FOREIGN PATENT DOCUMENTS 208307  9/1986  Japan ................................ 333/164

OTHER PUBLICATIONS

Naster, Ronald I. et al; "Affordable MMIC designs for Phased Arrays" *Microwave Journal;* Mar. 1987; pp. 141–197.

Wide-Band Monolithic Phase Shifter, Y. Ayasli, S. W. Miller, R. Mozzi and L. K. Hanes/IEEE Transaction on Microwave Theory and Techniques, vol. MTT-32, No. 12, Dec. 1984, pp. 1710–1714.

*Primary Examiner*—Benny Lee
*Attorney, Agent, or Firm*—Paul Checkovich; Stephen A. Young

[57] ABSTRACT

The invention relates to a switchable bidirectional phase shift network exhibiting a desired differential insertion phase suitable for use as a phase bit in a multi-bit phase shifter. The design is economical in its use of components—six field effect transistors, three inductors and no capacitors, and provides in one switching state a band pass network of low insertion phase and in the other switching state a low pass network of high insertion phase. The rate of change of insertion phase over a range of operating frequencies is substantially equal for the two states.

5 Claims, 5 Drawing Sheets

FIG. 2A BAND PASS STATE
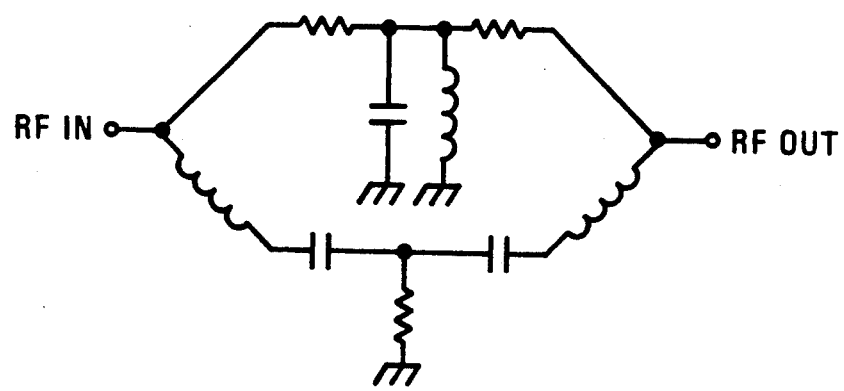
FIG. 2B BAND PASS STATE
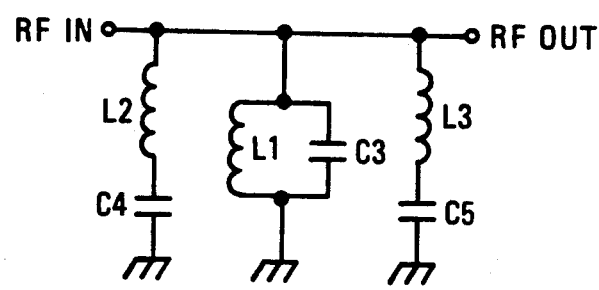
FIG. 2C BAND PASS STATE
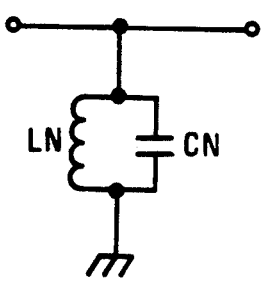
FIG. 3A LOW PASS STATE
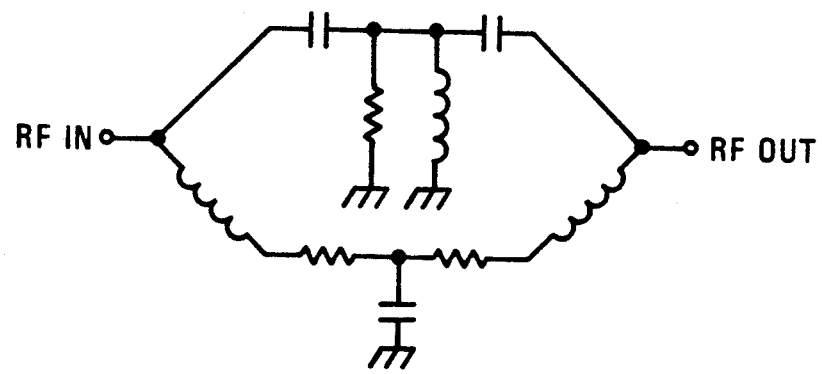
FIG. 3B LOW PASS STATE
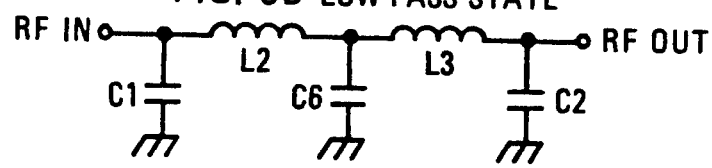

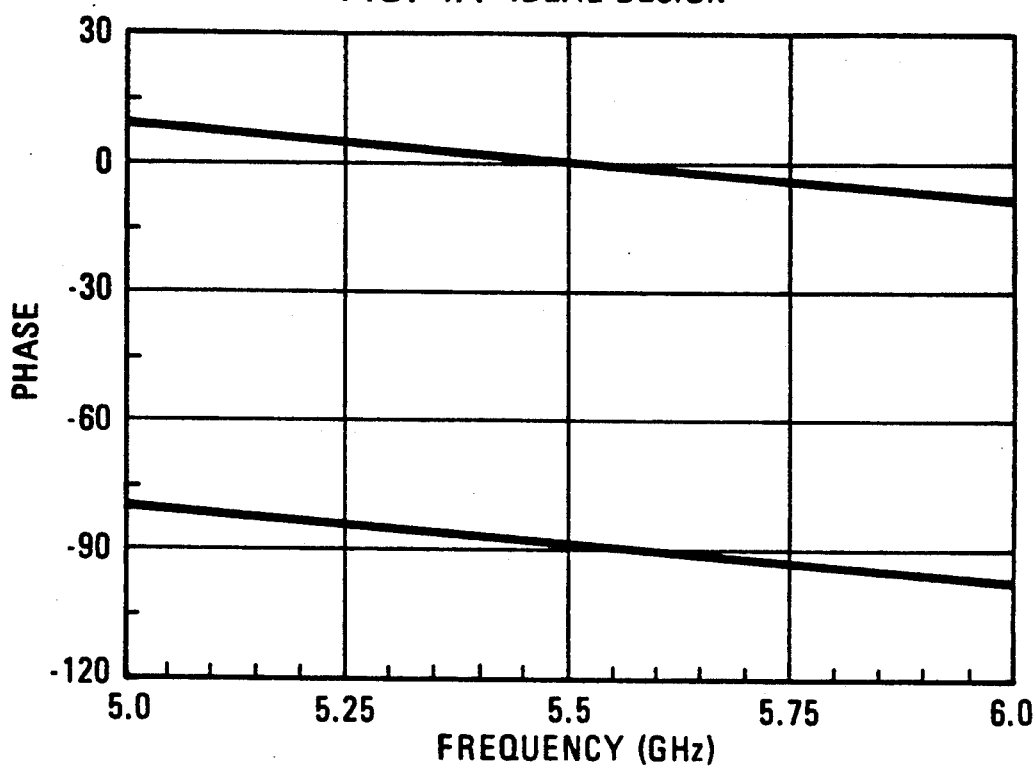
FIG. 4A IDEAL DESIGN
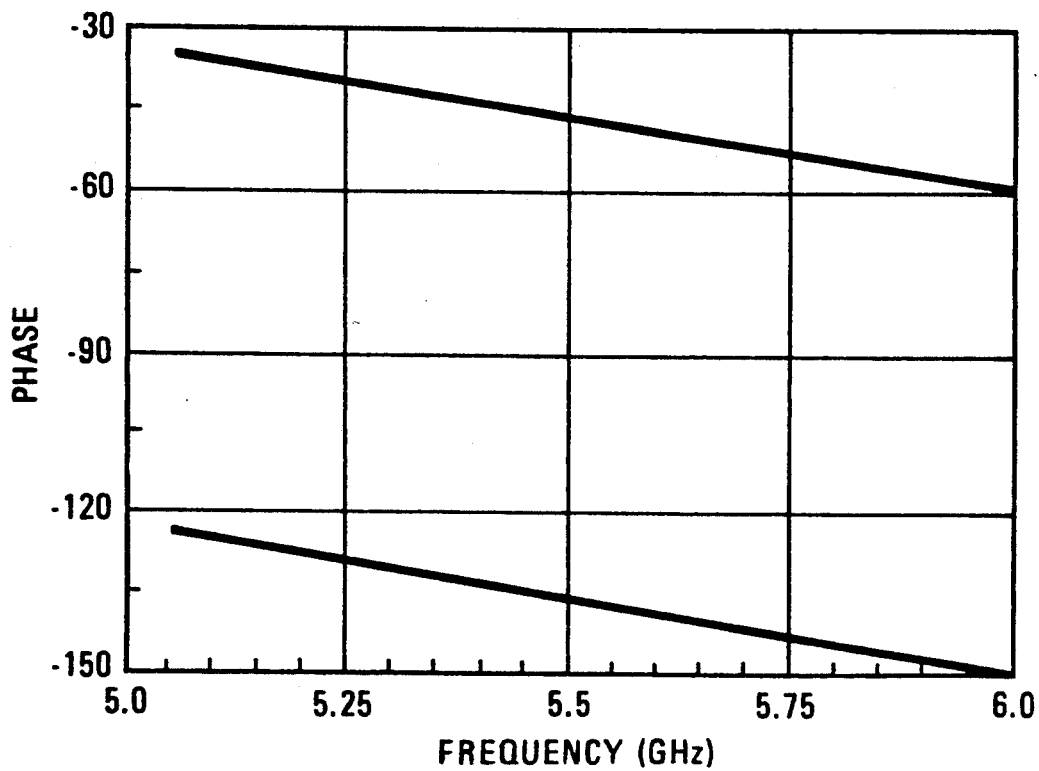
FIG. 4B FULL PARASITICS

MMIC (MONOLITHIC MICROWAVE INTEGRATED CIRCUIT) SWITCHABLE BIDIRECTIONAL PHASE SHIFT NETWORK

This invention was made with Government support under Contract No. F30602-84-C-0147 awarded by the U.S. Airforce. The Government has certain rights in this invention.

BACKGROUND OF THE INVENTION

1. Field of the Invention

The invention relates to integrated circuits for use at microwave frequencies, and more particularly to a switchable bidirectional phase shift network suitable for use as a phase bit in a multi bit phase shifter.

2. Prior Art

The present phase shift network is one of a class of phase shift networks in which the same phase response is required in the forward or reverse direction through the network, and in which the network takes either of two states, as a result of switching action, between which a fixed phase difference persists over a predetermined band of frequencies. A full choice of differential phase shifts at a given level of accuracy is ordinarily desired, and is achieved by the use of a plurality of phase shift networks in a multi bit phase shifter. The individual phase shift networks are usually called "phase bits", and have differential insertion phase values scaled in powers of two to achieve 360° of phase shift coverage. Typically the phase states of the phase shifter are distributed in 32, 64 or 128 (etc.) equal increments around 360° of total differential insertion phase coverage. The largest phase bit will usually represent one-half of 360°. The smallest phase bit will represent 1/32, 1/64, or 1/128 of 360° and will equal the differential phase increment between successive phase shifter states.

The individual "bits" of phase shifters need not be identical. The bits having the smaller differential insertion phase may need to be no more than a serial transmission line in parallel with a transistor switch to meet the requisite performance requirements. On the other hand, the bits exhibiting the larger differential insertion phase may require a relatively complex network. One known network provides two independent filter sections, one of which is operative in one state, and the other of which is operative in the other state. Such a filter is the well-known switchable low pass, high pass filter. This filter includes a pair of single pole double throw switches configured to insert a low pass filter in one state of phase response and to insert a high pass filter in the other state of phase response. This design, with the use of second order networks, can be made to operate over quite substantial bandwidths at microwave frequencies. The switching in such a filter may be provided by four field effect transistors configured to provide single pole double throw action.

The conventional low pass, high pass filter is, of course, too complex for many applications, particularly for smaller differential phase shifts, and in some practical cases at microwave frequencies may not be the best performing circuit.

Economic considerations are also of substantial importance in the design of phase shift networks. The conventional low pass, high pass filter is composed of inductors and capacitors and switches, switching normally being realized by field effect transistors. At microwave frequencies, field effect transistors are not simple switches but exhibit resistive and capacitive parameters. When costs are of concern, it may be preferable to minimize the component count to reduce the size of each "cell" containing a phase bit and thereby reduce the size of a phase shifter chip containing a plurality of phase bits. This consideration is important in MMIC constructions in which the passive components are formed on the surface of a substrate of a costly material such as Gallium Arsenide, also suitable for the formation of the active components. In MMIC applications, the smaller the layout that exhibits the required performance, the lower the circuit cost. A result of this design emphasis is to avoid unnecessary components and to be generally sparing of chip area in the distribution of components over the layout. The present invention applies these considerations to a switchable phase shift network for use in a phase shifter using MMIC fabrication techniques.

SUMMARY OF THE INVENTION

It is an object of the present invention to provide an improved switchable bidirectional phase shift network exhibiting a desired differential insertion phase between states.

It is another object of the present invention to provide an improved switchable bidirectional phase shift network for fabrication using monolithic microwave integrated circuit (MMIC) techniques.

It is a further object of the present invention to provide an MMIC switchable bidirectional phase network which uses a reduced number of components and is economical in substrate area.

These and other objects of the invention are achieved in accordance with the invention in a novel phase shift network having two signal connections, and which includes a Gallium Arsenide substrate on which six field effect transistors and three inductors are arranged.

The six transistors are arranged in two sets of three. In the first set, each transistor has one principal electrode connected to a first node and the other electrode of a first one is connected to the first signal connection, the other electrode of a second one is connected to the second signal connection, and the other electrode of the third transistor is connected to signal ground. The first inductor is connected between the principal electrodes of the third transistor.

In the second set of three transistors, each has one principal electrode connected to a second node, and the other electrode of one is connected through a second inductance to the first signal connection, the other electrode of the second one is connected through a third inductance (equal to the second) to the second signal connection, and the other electrode of the third transistor of the second set is connected to ground.

The phase shift network is provided with two complementary control connections one connection joining, for dc control only, the first two transistors of the first set and the third transistor of the second set, and the other connection joining, for dc control only, the first two transistors of the second set and the third transistor of the first set. In one state of the phase shift network in which the first control connection is "high" biasing the transistors "on" so that they exhibit a small resistance and the second control connection is "low" biasing the transistors "off" so that they exhibit a capacitance, the network approximates a band pass network consisting of an LC shunt network connected in shunt with the signal path and having a modest phase advance changing to a phase delay as the frequency increases through resonance.

In the other state of the phase shift network in which the first group of transistors are "low" and the second group "high", the network may be reduced to a second order low pass network having a substantial phase delay. By proportioning the individual components it is possible for the two states of the phase shift network to exhibit a constant differential insertion phase over a moderate bandwidth.

The circuit is economical because of its small size which is caused by the restricted number of components required, requiring only six field effect transistors, three inductors, and no capacitors, and because it is less sensitive to manufacturing variations which means that it will have a higher yield in production. The circuit is accurate in that the capacitances required in the design are provided by field effect transistors with a high degree of accuracy, and because the inductances are provided by inductors with air bridges suitable for laser trimming in the prototype stage to achieve more exact inductance values in the final IC, the latter normally being duplicated with masks modified to match the prototypes.

DESCRIPTION OF THE DRAWINGS

The inventive and distinctive features of the invention are set forth in the claims of the present application. The invention itself together with further objects and advantages thereof may best be understood by reference to the following description and accompanying drawings in which:

FIG. 1A shows Applicant's novel phase shifter which is a switchable, low pass, band pass phase shifter; FIG. 1B representing a standard switchable low pass, high pass, phase shifter; and FIG. 1C illustrates a more recent modification of the switchable low pass, high pass, phase shifter of FIG. 1B;

FIGS. 2A, 2B and 2C are successively simplified equivalent circuit representations of the novel phase shift network illustrated in FIG. 1A when it is in a band pass state exhibiting the smaller insertion phase; FIG. 2A illustrating the equivalent circuit before simplification; FIG. 2B illustrating the equivalent circuit after a first simplification; and FIG. 3C illustrating the final simplification in which it appears as a parallel resonant circuit;

FIGS. 3A and 3B are successively simplified equivalent circuit representations of the novel phase shift network illustrated in FIG. 1A, when it is in a low pass state exhibiting the larger insertion phase; FIG. 3A illustrating the equivalent circuit before simplification and FIG. 3B illustrating the equivalent circuit after simplification, in which it appears as a second order pi network;

FIGS. 4A and 4B are graphs illustrating the computed phase difference between low pass and band pass states through the desired operating band of frequencies, FIG. 4A illustrating the ideal design, and FIG. 4B the design taking into account known parasitics associated with the layout of the circuit;

DESCRIPTION OF THE PREFERRED EMBODIMENT

Figure 1A:
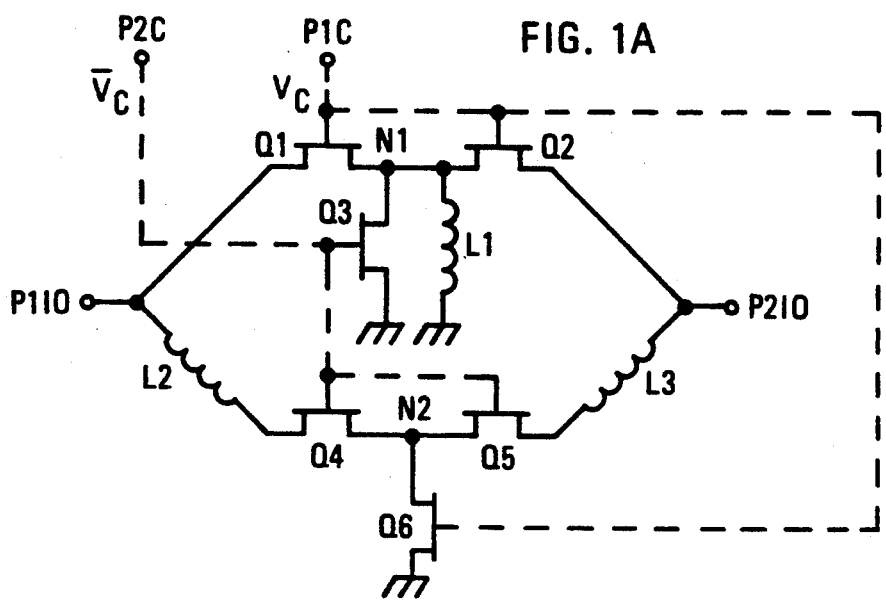
FIGS. 1A, 1B and 1C are electrical circuit representations of phase shift networks.

Referring now to FIG. 1A, the electrical circuit of a novel switchable phase shift network in accordance with the invention is illustrated. The phase shift network is compact and reproduction tolerant. As best been in FIGS. 6, which illustrates the layout of the phase shift network in a 6 bit phase shifter, it is fabricated using monolithic microwave integrated circuit (MMIC) techniques upon a Gallium Arsenide substrate. It is designed for use over a range of operating frequencies which, in a practical example, is from 5 to 6 GHz.

The novel phase shift network is designed to exhibit a desired differential insertion phase between states with a prescribed accuracy over the prescribed range of operating frequencies. The phase shift network is thus designed to exhibit one differential insertion phase, (i.e. 90°) while another similar network exhibits a differential insertion phase of 45°, and another of $22\frac{1}{2}°$, as each phase shift network becomes an individual "phase bit" in a larger digital phase shift network (e.g. the phase shift network illustrated in FIGS. 5, 6. In such a network, 360° of insertion phase coverage is achieved in equal steps. This is achieved by scaling the individual phase bits for binary operation, with the phase shifter exhibiting the smallest differential insertion phase representing the stepping increment. The phase shift network herein described is illustrated as a phase bit in a 6 bit phase shifter in which the smallest bit is $5\frac{5}{8}°$, and in which there are $2^6$ or 64 insertion phase values. The present phase shift network could also be used in applications requiring larger or smaller phase increments.

The phase shift network is disposed as a serial component in a system in which the absolute phase shift in either of the two states is not of primary concern, and is normally compensated for. However, the difference in phase between the states is of primary concern and is normally held at least to the accuracy of the system (i.e. to within 2 13/16 degrees in a six bit arrangement.)

The phase shift network has four external connections and ground for signal and control purposes. The phase shift network is designed to be connected in series with other similar phase shift networks on the same integrated circuit using, for example, 50 ohm signal connection paths. As seen in FIG. 1A, the signal connection to the left of the phase shift network, bears the reference numeral P1IO and that to the right of the phase shift network bears the reference numeral P2IO. If one signal connection is an input then the other becomes the output. The roles may be reversed without consequence, since the phase shift network permits signal flow in either direction.

The control voltages applied to the control pads P1C and P2C establish the state of the phase shift network. In one state of the controls, the phase shift network becomes a low pass network and in the other state of the controls, the phase shift network becomes a band pass network. The control pads P1C and P2C are connected to the gates of the transistors in the phase shift network. The control voltages are selected to be logical complements, with one "high" while the other is "low". A field effect transistor to which a "high" control potential is applied acts as a small valued resistor, while one to which a "low" control potential is applied, acts as a capacitor. The collective states of the individual transistors, some of which are "high" and some of which are "low", determines whether the phase shift network is in a low pass or a band pass state.

The switchable phase shift network employs only field effect transistors (Q1 to Q6) which, as noted, act as either capacitors or small valued resistors, and inductors all of which are formed on a common Gallium Arsenide substrate. Each field effect transistor has a pair of principal electrodes into and out of which the signal flows and a gate for application of a control potential to determine which state the transistor will be in. Each transistor, when the gate is in the "high" state exhibits principally a bidirectional low resistance between principal electrodes. When in the "high" state, a signal introduced into one principal electrode will pass to the other electrode with miminal attenuation. The gate is in a "high" state when the gate potential is at a zero volt dc potential and the source and drain are also at a zero volt dc potential. Each transistor, when the gate is in a "low" state, exhibits principally a capacitive reactance between principal electrodes. The resistance which may appear between principal electrodes is very high and may be ignored in an initial analysis. The gate is in a "low" state when the gate potential is more negative than the pinch off voltage of the FET channel (typically from $-3$ to $-6$ volts), assuming that the principal electrodes remain at zero volts.

In the circuit of the phase shift network, the six field effect transistors and three inductors are connected as follows. The transistors are arranged into two sets of three transistors. One set of three transistors (Q1 Q2 and Q3) is grouped about a first node N1 to which a first principal electrode of each transistor is connected. The other principal electrode of the transistor Q1 is connected to the signal connection P1IO and the other principal electrode of the transistor Q2 is connected to the signal connection P2IO. The other principal electrode of the transistor Q3 is connected to substrate ground. The first inductor L1 is connected between the node N1 and substrate ground.

The second set of three transistors Q4, Q5 and Q6 all have one principal electrode connected to a second node N2. The other principal electrode of the transistor Q4 is connected through the inductor L2 to the signal connection P1IO and the other principal electrode of the transistor Q5 is connected through the inductor L3 to the second signal connection P2IO. The transistor Q6 has the other principal electrode connected to substrate ground.

In each ground connection, "ground" is a substrate ground, provided by a metallization on the undersurface of the substrate to which connection is made by VIA holes passing from the top of the substrate to the undersurface.

The phase shift network is subject to control from one insertion phase state to the other by changing the polarity of the complementary potentials applied to the control pads P1C and P2C. The gates of the transistors Q1, Q2 and Q6 are connected to the control pad P1C for application of a first dc control voltage Vc. They are, however, decoupled for radio frequency signals so as to achieve mutual rf isolation. The rf decoupling means takes the form of series resistors RI (seen best in FIG. 6) and the self inductance in the dc paths. The gates of transistors Q3, Q4 and Q5 are connected to the control pad P2C for application of a second control voltage $\overline{Vc}$, complementary to the first control voltage. Accordingly, in a first insertion phase state, Vc is high and $\overline{Vc}$ is low. In this state transistors Q1, Q2 and Q6 become equivalent to a resistor of low value and transistors Q3, Q4 and Q5 become equivalent to a capacitor. In the second insertion phase state, Vc is low and $\overline{Vc}$ is high. In this state, transistors Q1, Q2 and Q6 become equivalent to a capacitor and transistors Q4, Q5 and Q6 become equivalent to a resistor of low value.

The consequences of the foregoing changes in equivalency of the transistors in the two insertion phase states of the phase shift network are depicted in FIGS. 2A, 2B and 2C, where the phase shift network becomes a band pass network, and 3A and 3B, where the phase shift network becomes a low pass network.

The first insertion phase state of the phase shift network is depicted in FIGS. 2A, 2B and 2C. These figures illustrate the transformation of the phase shift network to a parallel resonant band pass network having a small insertion phase changing from a phase advance to phase delay as the frequency increases through resonance. FIG. 2A illustrates the immediate consequence of substituting capacitors and resistors for the appropriate transistors. In particular, transistors Q1, Q2 and Q6 have been replaced by resistors, and transistors Q3, Q4 and Q5 have been replaced by capacitors. The FIG. 2A network may then be transformed using conventional conversion rules and treating the resistances as being negligibly small. The result is three shunt circuits; the first and third being an inductor and capacitor in series and the second one being an inductor and capacitor in shunt.

Capacitors C3, C4 and C5 are the off state capacitances associated with transistors Q3, Q4 and Q5 respectively. Optimum circuit performance is obtained with a symmetrical circuit so it may be assumed that the values of Capacitors C4 and C5 are equal and that the values of Inductors L2 and L3 are equal.

The circuit shown in FIG. 2B is equivalent to a net frequency dependent shunt inductor (LN) and a net frequency dependent shunt capacitor (CN) as shown in FIG. 2C. The values of these two components are given by the following formulae:

$$LN = \frac{L1}{1 - w^2 L1\, C3\,(1 - \alpha)} \quad (1)$$

$$CN = \alpha C3 + \frac{2\, C4}{1 - w^2 L2\, C4} \quad (2)$$

where $w = 2\pi x$ frequency Where Alpha is a constant whose value lies in the range 0 to 1 and which can be selected by the designer to optimize the electrical performance of the circuit in respect to impedance, loss and bandwidth. Over a narrow bandwidth the net inductance LN and net capacitance CN can be treated as being approximately constant, and their product a constant. In the idealization where the resistances of the field effect transistors are negligible, the value of Alpha does not affect the resonant frequency, or the rate of change of the insertion phase at resonant frequency. (This matter will be further discussed below.)

The second insertion phase state of the phase shift network is depicted in FIGS. 3A and 3B, which show the transformation of phase shift network to a second order pi network having a greater phase delay than the band pass state. FIG. 3A illustrates the immediate consequence of substituting capacitors and resistors for the appropriate transistors. The FIG. 3A network may then be transformed using conventional conversion rules, and treating the resistances as being negligibly small. The result is the second order pi network illustrated in FIG. 3B, which is a conventional low pass filter configuration, and one in which a relatively large phase delay is to be expected. The ideal proportioning of the filter is one in which the two inductors are of equal value, and the capacitors at input and output are equal and the capacitor at the central node is twice that of the other two, consistent with the assembly of two identical pi sections of like valued capacitors.

Figure 1B:
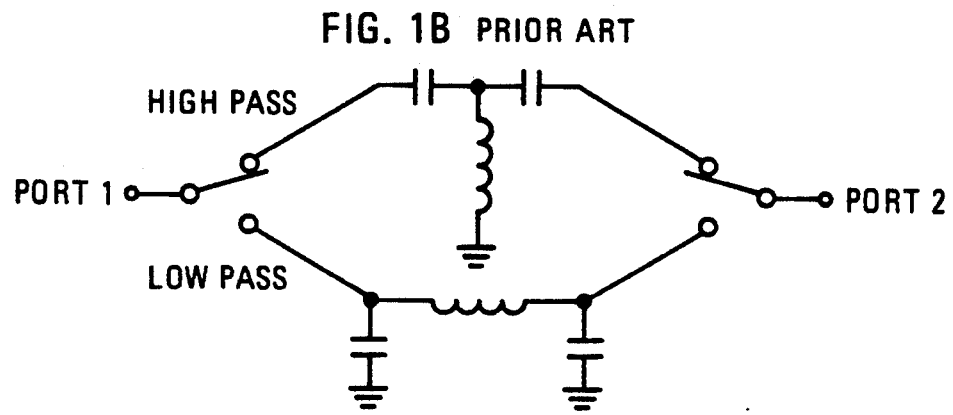

The present switchable phase shift network may be compared, for a better understanding, to two known switchable phase shift networks. The first, which is illustrated in FIG. 1B, consists of a pair of ganged single pole double throw switches at the signals ports, a high pass tee network, and a low pass pi network. When the switches are in the upper position, the high pass Tee network, which consists of a pair of series capacitors and a shunt inductor, are connected in the circuit and the circuit exhibits a phase advance. When the ganged switches are in the lower position, the low pass pi network, which consists of a pair of shunt capacitors and a series inductor, are connected in the circuit and the network exhibits a phase delay.

Figure 1C:
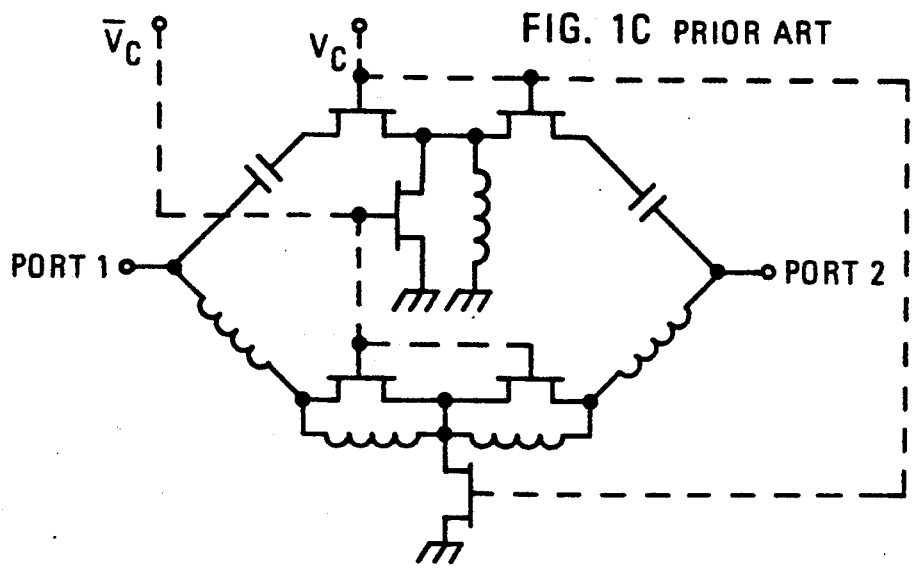

The second phase shift network illustrated in FIG. 1C, may be derived from the FIG. 1B circuit. Here the switching is provided by six field effect transistors, in a circuit requiring five inductors and two capacitors. The second phase shift network emulates the first known phase shifter network in that it may be reduced to a tee network (however of a second order) in the high pass state exhibiting a phase advance and a pi network (also of a second order) in the low pass state exhibiting a phase delay.

The present circuit of FIG. 1A differs from the circuit of FIG. 1C in its use of two less inductors, two less capacitors and thus no capacitors, and because it reduces to a band pass circuit in one state and a low pass circuit in another state rather than to a high pass circuit in one state and a low pass circuit in the other state.

The present design requires establishing the sizes, and therefore the capacitance values of the field effect transistors. Transistors Q1 and Q2 are of like geometry to achieve like capacitance values. Similarly, transistors Q4 and Q5 are of like geometry to achieve like capacitance values. In addition, the inductance values of inductors L2 and L3 are equal. With the network impedance (e.g. 50 ohms) the center frequency and the phase shift of the network specified, the values of the components in the low pass network (inductors L1, L2 and the capacitances of Q1, Q2 and Q6) become determined. The insertion phase of this circuit is proportional to the frequency. The required double center capacity for a second order pi network is largely made up of the capacitance of transistor Q6. This requires that transistor Q6 be larger than the transistors Q1 and Q2 by a factor of about two.

In practical designs of smaller phase bits where it is desired to equalize the loss in the two states of the phase bit, it is convenient to allow the capacitance of Q6 to be smaller than that of Q1 and Q2. In this situation the low pass network is no longer an ideal second order network. Satisfactory phase delay performance is still possible over a slightly reduced bandwidth.

After determination of the parameters of the second order pi network for the low pass state, the values of the network for the band pass state (see the FIG. 2C equivalent circuit) may be determined. The point of resonance is set at the center of the range of operating frequencies, which sets the product of the net inductance LN and the net capacitance CN of the FIG. 2C circuit. The parameter selections for the low pass state also determine the rate of change of the insertion phase of the network with frequency. In order to achieve the desired constant difference in insertion phase between the phase states across a finite operating bandwidth, it is necessary to select the remaining element values so that the rate of change of the insertion phase in the band pass state exactly equals the rate of change of the insertion phase for the low pass state. The rate of change of the insertion phase with frequency of the filter in the band pass state is set by the ratio of net inductive reactance (LN) to net capacitive reactance (CN) (e.g. as in FIG. 2C), the larger inductive reactance tending to reduce the negative slope and the smaller inductive reactance tending to increase the negative slope. Thus the product and the ratio of the net capacitance and the net inductance shown in FIG. 2C are defined. So the values of the net inductance (LN) and net capacitance (CN) can both be calculated. The values of the components, which were not specified in the design of the low pass state (inductor L1 and capacitances of the transistors Q3, Q4 and Q5), must be selected such that they give the required values of LN and CN via equations 1 and 2. These equations do not uniquely define the component values, and with the remaining design flexibility, one may, as earlier suggested, optimize other important design parameters such as the insertion loss and bandwidth, which have not been considered in this simplified analysis.

In three practical phase shift networks having a differential phase shift of $22\frac{1}{2}°$, 45° and 90°, operating over a frequency range of from 5 to 6 GHZ centered at 5.5 GHZ, the following design parameters were computed:

|  |  | $22\frac{1}{2}°$ | 45° | 90° |
| --- | --- | --- | --- | --- |
| Transistors | Q1 and Q2 | 0.13 pF | 0.13 pF | 0.22 pF |
|  | Q3 | 0.038 pF | 0.043 pF | 0.051 pF |
|  | Q4 and Q5 | 0.13 pF | 0.14 pF | 0.23 pF |
|  | Q6 | 0.041 pF | 0.19 pF | 0.47 pF |
| Inductors | L1 | 3.58 nH | 2.32 nH | 1.17 nH |
|  | L2 and L3 | 0.26 nH | 0.52 nH | 1.04 nH |

The phase response with frequency of the two states of a phase bit designed to provide a 90° phase difference is illustrated in FIGS. 4A and 4B. FIG. 4A represents the ideal design while FIG. 4B represents the practical realization which includes the layout effects. These layout effects increase the phase delay at the center of the band from 0° in the ideal case to approximately 45° in the practical case. The phase delay in the practical realization of the low pass network was increased to 135° at the center frequency to compensate for this. In the practical realization, a 90° phase difference was maintained to a constant value, well within the permissable design error, of almost 3 degrees, which corresponds to one-half the smallest phase step.

Figure 5:
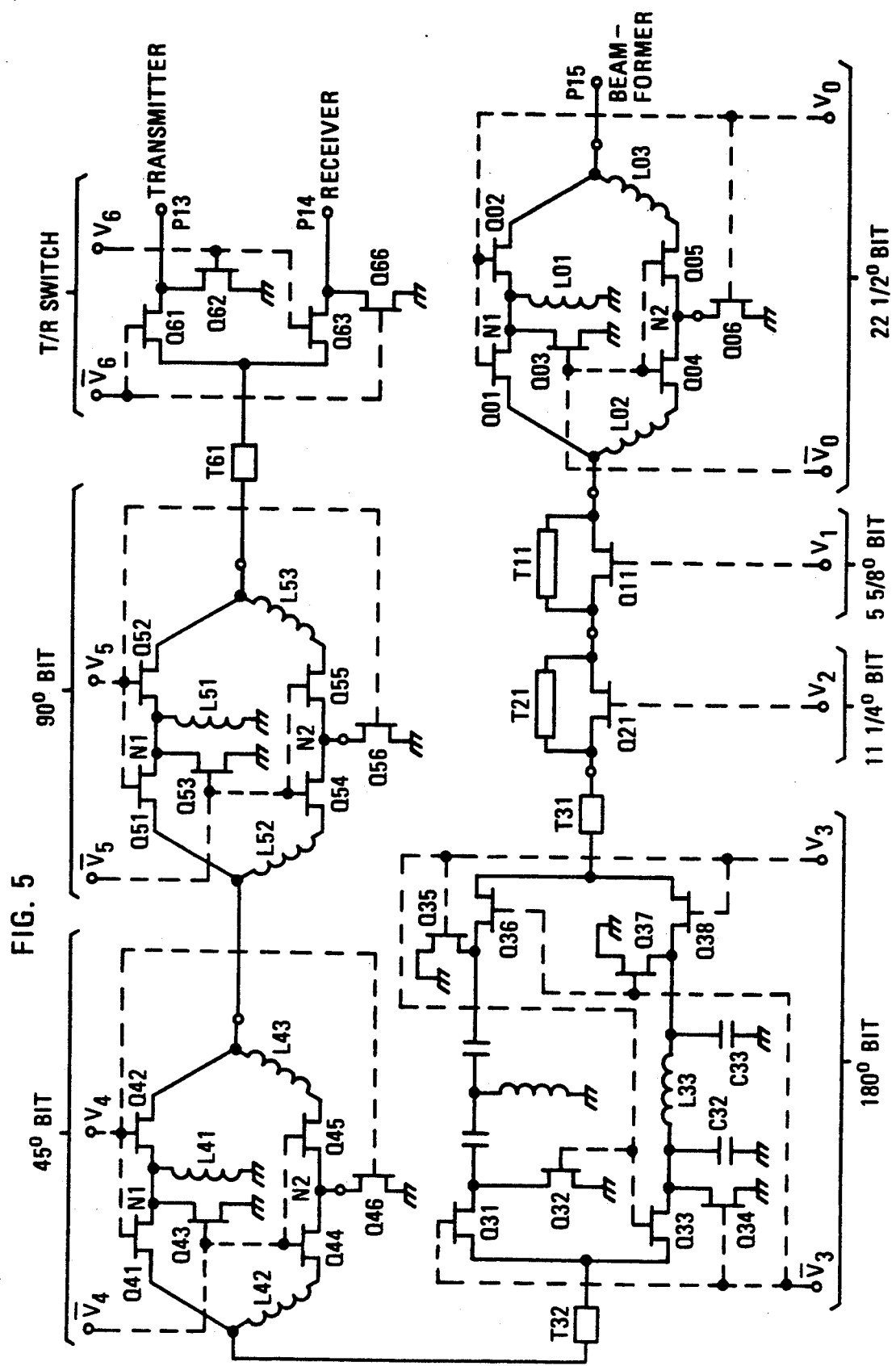
FIG. 5 is an electrical circuit representation of a digital phase shifter in which a relative phase delay occurring in sixty-four ($2^6$) equal steps from zero to $354\frac{3}{8}°$ is provided.
Figure 6:
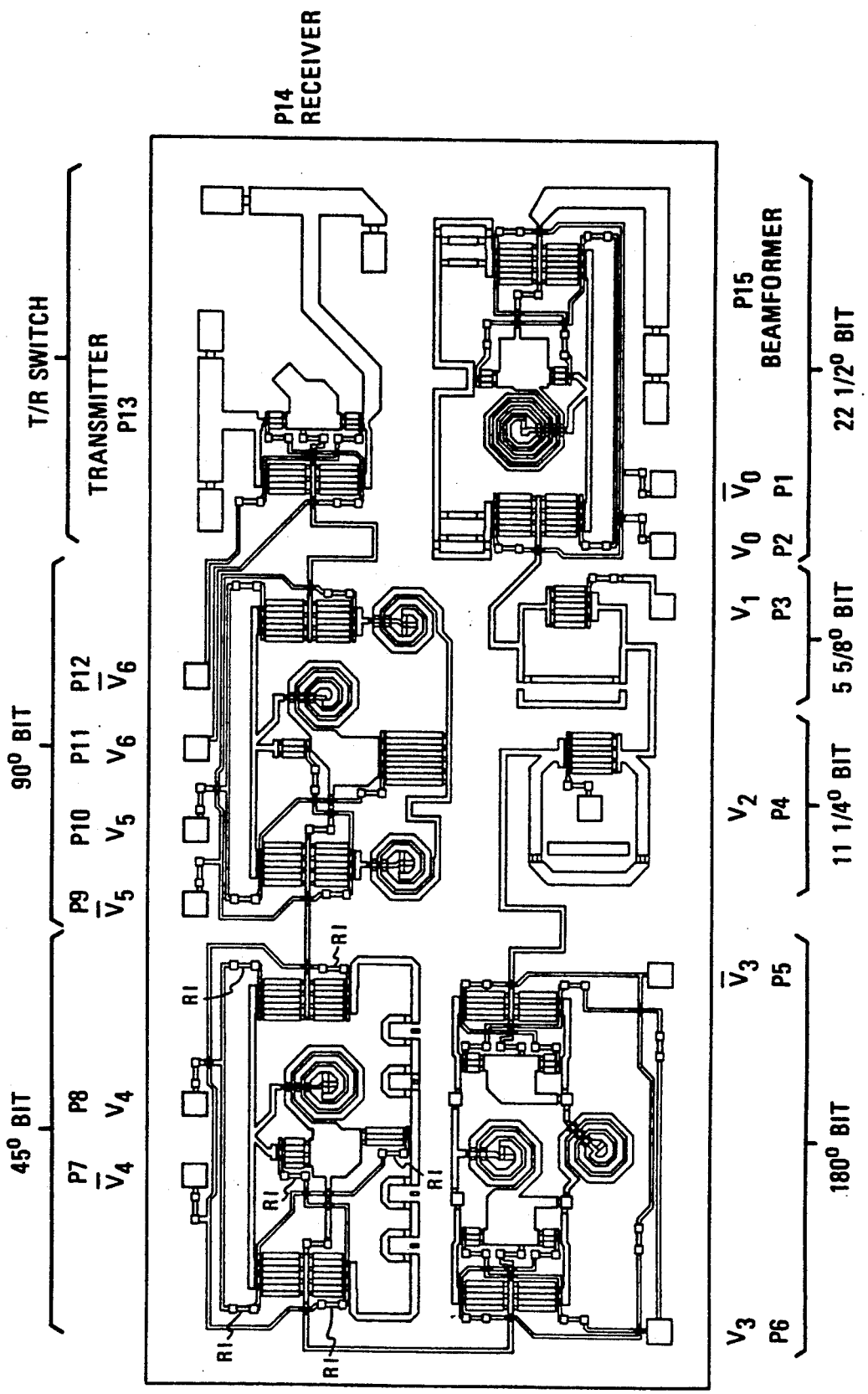
FIG. 6 is a plan view of the layout of the phase shifter illustrated in FIG. 5.

The phase shift network, which has been described, is applied to the 6 bit phase shifter illustrated in FIGS. 5, 6. Here it is desired to produce regularly spaced phase differences from zero to 360°. In the 6 bit phase shifter, the present phase shift network is used to provide the $22\frac{1}{2}°$ bit, the 45° bit and the 90° bit. A simpler network is used to provide a $5\frac{5}{8}°$ and $11\frac{1}{4}°$ bit and a more complex network is used to provide a 180° bit. The latter network is an example of the low pass, high pass network of the prior art. Each of the single pole double throw switches has been realized using four field effect transistors. The 6 bit phase shifter terminates with a transmit/-receive switch feeding a transmitter at one pad (P13) and fed by a receiver at the other pad (P14). The input to the 22½° bit is coupled to pad P15 for connection to the beamforming network of the antenna array.

A plan view of the layout of the circuit of FIG. 5 illustrating the disposition of the components and their relative sizes and the provisions for dc energization including resistors (RI) as RF decoupling means for mutual RF insolation of the transistor gates are shown in FIG. 6. FIG. 5 shows a 22½° bit, a 45° bit, and a 90° bit of the same circuit configuration as in FIG. 1A. Circuit components in FIG. 5 have the same unit place reference numerals as in FIG. 1A. (e.g. Q01, Q41 and Q51 of FIG. 5 each correspond to transistor Q1 in FIG. 1A.) Its actual dimensions are 5.1 by 2.2 mm.

The layout has been optimized in respect to earlier designs for minimum chip size. As illustrated, the individual phase bits of the phase shifter are distributed along two lines, the signal path going from the right corner along the bottom of the chip to the left, transferring to the upper left corner, and then returning in a second line along the top of the chip to the upper right. The first phase bits are in an order dictated primarily by layout convenience. The initial 22½° bit (in the lower right) is then followed by the 5⅝° bit, the 11¼° bit and the 180° bit on the lower line. In the upper line, the first bit to the left is the 45° bit, followed by the 90° bit, and the TR switch.

The present design is easy to produce from the initial design and of good accuracy. There are no capacitors per se, and the circuit uses only inductors and transistors the RF signal paths. The effective capacitances of the transistors are easily determined, and accurately reproduced adding to a relatively high degree of predictability in the design. The inductors, for which some uncertainty exists, are provided with multiple inner air bridge taps which may be removed by a laser where necessary to reach the design optimum. Once optimized, the "art work" is usually changed to reproduce the optimum air bridge configuration, rather than correcting the integrated circuits one at a time.

The circuit, because of its elimination of capacitors and the reduction in numbers of inductors, is quite small and therefore economic as well as accurate, when compared with competitive phase shifter designs. A further factor which makes this circuit less expensive to manufacture than competitive phase shifter designs is the fact that its phase shift is less sensitive to variations in the manufacturing process. This means that a higher yeild can be expected.

What is claimed is:

1. A monolithic microwave integrated circuit (MMIC) switchable bidirectional LC phase shift network, exhibiting a desired differential insertion phase between states over a range of operating frequencies comprising:

A. a substrate of Gallium Arsenide having a ground plane on the underside thereof, B. a first input-output port, C. a second input-output port, D. six field effect transistors (Q1–Q6) each having a pair of principal electrodes and a gate for application of a control potential, each transistor, when the gate is in a "high" state exhibiting principally a bidirectional low resistance between principal electrodes, and when the gate is in a "low" state exhibiting principally a bidirectional capacitive reactance between principal electrodes, E. one principal electrode of each transistor of the set Q1 Q2 and Q3 being coupled to a first node N1, the other principal electrode of transistor Q1 being connected to said first port, the other principal electrode of transistor Q2 being connected to said second port, and the other principal electrode of transistor Q3 being connected to substrate ground, F. three inductors L1, L2 and L3; a first inductor L1 being connected between node N1 and substrate ground, G. the second and third inductors L2, L3 having equal values, the inductor L2 having one terminal connected to said first port, and the inductor L3 having one terminal connected to said second port, H. one principal electrode of each transistor of the set Q4 Q5 and Q6 being connected to a second node N2, the other principal electrode of transistor Q4 being connected to the other terminal of said second inductor L2, the other principal electrode of transistor Q5 being connected to the other terminal of said third inductor L3, and the other principal electrode of transistor Q6 being connected to substrate ground, I. control means for achieving a differential phase shift, comprising a first control terminal (P1C) connected to the gates of transistors Q1, Q2 and Q6 for application to a first control signal, and a second control terminal (P2C) connected to the gates of transistors Q3, Q4 and Q5 for application to a second control signal, complimentary to the first control signal, the application of a "high" from said first control terminal (P1C) simultaneously with the application of a "low" from said second control terminal P2C causing a first, band pass in which each of the transistors Q1, Q2 and Q6 becomes conductive and equivalent to a resistor of low value and each of the transistors Q3, Q4, and Q5 becomes non-conductive and equivalent to a capacitor, the relatively low equivalent resistances of the transistors being small in relation to the reactive impedances to form an equivalent network consisting of three shunt branches, the first a series LC branch, the second a parallel LC branch, and the third a series LC branch, said equivalent network being approximating a single shunt LC branch exhibiting a small phase delay or phase advance varying linearly over a given operating range of frequencies, the application of a "low" from said first control terminal (P1C) simultaneously with the application of a "high" from said second control terminal (P2C) causing a second, low pass state in which each of the transistors Q1, Q2 and Q6 becomes non-conductive and equivalent to a capacitor, and each of the transistors Q3, Q4 and Q5 becomes conductive and equivalent to a resistor of low value, the relatively low equivalent resistances of the transistors being small in relation to the reactive impedances to form an equivalent network approximating a second order pi phase delay network exhibiting a larger phase delay than in the first state, and varying linearly over said given operating range of frequencies, the slopes of the insertion phase versus frequency in said two states being substantially equal to maintain a constant insertion phase difference over said given operating range.

2. The LC phase shift network set forth in claim 1 wherein transistors Q1 and Q2 are of equal capacitance, and transistors Q4 and Q5 are of equal capacitance.

3. The phase shift network set forth in claim 2 wherein said circuit values are selected such that in said band pass state, the phase shift network exhibits an insertion phase changing from a small phase advance to a small phase delay as the frequency is increased through said operating range.

4. The phase shift network set forth in claim 3 wherein for operation in said low pass state, the values of the capacitances of transistors Q1 and Q2 are set equal at approximately one-half the value of the capacitance of transistor Q6 to form two cascaded pi sections of like values, the values of L2 and L3 and the capacitances of transistors Q1, Q2 and Q6 are selected to achieve like input and output impedances at a desired value over said given operating range, the values of L2 and L3 and the capacitances of transistors Q1, Q2 and Q6 are selected so that the insertion phase delay of the network in said low pass state provides the desired phase shift at the center of said operating range, said selection also determining the rate of change of insertion phase with frequency.

5. The LC phase shift network set forth in claim 4 wherein for operation in said band pass state, the values of the inductance L2 and of the capacitance of transistor Q4 and the values of the inductance of L3 and of the capacitance of transistor Q5 are selected to be series resonant at a frequency above said range center to form net shunt capacitive reactances, and the values of the inductance L1 and of the capacitance of the transistor Q3 are selected to be parallel resonant at a frequency above said range center to form a net shunt inductive reactance in said range, in parallel with said net shunt capacity to form a shunt connected parallel circuit, resonant at the center of said range.

* * * * *